United States Patent
Steuer et al.

(10) Patent No.: US 11,693,033 B2
(45) Date of Patent: Jul. 4, 2023

(54) SENSOR PROBE WITH COMBINED NON-CONTACT SENSOR AND A ROGOWSKI COIL

(71) Applicant: Fluke Corporation, Everett, WA (US)

(72) Inventors: Ronald Steuer, Hinterbrühl (AT);
Ginger M. Woo, Shoreline, WA (US);
Gloria M. Chun, Seattle, WA (US);
Simon J. Page, Snohomish, WA (US)

(73) Assignee: Fluke Corporation, Everett, WA (US)

( * ) Notice: Subject to any disclaimer, the term of this patent is extended or adjusted under 35 U.S.C. 154(b) by 13 days.

(21) Appl. No.: 17/465,609

(22) Filed: Sep. 2, 2021

(65) Prior Publication Data

US 2023/0069419 A1    Mar. 2, 2023

(51) Int. Cl.
*G01R 15/18* (2006.01)

(52) U.S. Cl.
CPC .................. *G01R 15/181* (2013.01)

(58) Field of Classification Search
CPC .... G01R 15/181; G01R 1/203; G01R 15/146; G01R 19/0007
USPC .......................................................... 324/126
See application file for complete search history.

(56) References Cited

U.S. PATENT DOCUMENTS

| | | | |
|---|---|---|---|
| 2005/0184722 A1* | 8/2005 | Gregorec | G01R 1/04 324/126 |
| 2011/0012587 A1* | 1/2011 | Greenberg | G01R 15/181 324/114 |
| 2013/0076343 A1* | 3/2013 | Carpenter | G01R 1/22 324/252 |
| 2016/0204617 A1 | 7/2016 | Gilbert et al. | |
| 2016/0241058 A1* | 8/2016 | Carralero | H02J 7/005 |
| 2019/0346484 A1 | 11/2019 | Worones | |
| 2019/0346492 A1 | 11/2019 | Worones et al. | |

FOREIGN PATENT DOCUMENTS

WO    WO-2015031359 A1 *    3/2015    ............... C10G 1/02

OTHER PUBLICATIONS

Dent Instruments, Optimizing Performance from Rogowski Coil Current Transformers (https://www.dentinstruments.com/optimizing-performance-from-rogowski-coil-current-transformers/, last accessed Nov. 11, 2022) (Year: 2022).*
Extended European Search Report, dated Jan. 24, 2023, for European Application No. 22193747.7-1001, 8 pages.

* cited by examiner

*Primary Examiner* — Jermele M Hollington
*Assistant Examiner* — Robert P Alejnikov, Jr.
(74) *Attorney, Agent, or Firm* — Seed Intellectual Property Law Group LLP

(57) ABSTRACT

One or more implementations of the present disclosure are directed to sensor probes of measurement systems for measuring a plurality of electrical parameters, (e.g., voltage, current) of a conductor and methods for measuring same. In at least one implementation, the sensor probe integrates a Rogowski coil and a non-contact voltage sensor that are arranged relative to each other such that when positioned to measure a conductor, such as a wire, the Rogowski coil and the non-contact voltage sensor are held in proper position for measurement.

20 Claims, 13 Drawing Sheets

SENSOR PROBE WITH COMBINED NON-CONTACT SENSOR AND A ROGOWSKI COIL

BACKGROUND

Technical Field

The present disclosure generally relates to sensor probes and measurement instruments comprising sensor probes.

Description of the Related Art

Measurement instruments, such as multimeters, are configured to measure more than one electrical parameter, such as voltage and current. These measurement instruments are often used for troubleshooting, service, and maintenance applications, often requiring many measurements over a period of time. To obtain measurements, sensor probes may be arranged relative to a conductor under test.

Typically, measurement instruments use various sensor probes to measure the various electrical parameters of a conductor. For instance, to measure a conductor's current and voltage, typically two different sensor probes are held relative to the conductor under test. Accordingly, the user may have to couple and decouple the two different sensor probes from the measurement device and hold the various sensor probe in place during testing.

In many situations, such as in tight spaces, holding the sensor probe about a conductor to be tested can be awkward and cumbersome, and in some cases dangerous. Accordingly, improved electrical parameter measurement devices are desired.

BRIEF SUMMARY

One or more implementations of the present disclosure are directed to sensor probes of measurement systems for measuring a plurality of electrical parameters (e.g., voltage, current) of a conductor, and methods for measuring same. In at least one implementation, the sensor probe integrates a Rogowski coil and a non-contact voltage sensor that are arranged relative to each other such that when positioned to measure a conductor, such as a wire, the Rogowski coil and the non-contact voltage sensor are held in proper position for measurement. Accordingly, a user may be able to be separated from the sensor probe, while the sensor probe senses an electrical parameter of the conductor.

In at least one implementation, the sensor probe includes a Rogowski coil that forms a loop and the non-contact sensor comprises a sensor element located on an inner surface of a pair of jaws of a spring loaded clamp. The pair of jaws of the clamp is arranged to hold the conductor under test at a central region of the loop formed by the Rogowski coil so that the conductor is in proper position for testing. More particularly, the pair of jaws of the clamp is arranged relative to the Rogowski coil such that the conductor under test extends perpendicular through a central region of the plane of the loop formed by the Rogowski coil.

In general, it is desirable to have the conductor under test in a center region of the Rogowski coil. That is, locating a conductor to be tested in a center region of the Rogowski coil is an optimum location for accurate current readings. The arrangement of the non-contact sensor and the Rogowski coil optimizes the location of the conductor under test such that the non-contact sensor and the Rogowski coil can continuously take measurements of the conductor under test without continuous user manipulation or intervention.

The jaws of the clamp are configured to hold the conductor under test so that a surface of an insulative material around the conductor under test aligns with and abuts a non-contact sensor element. In some implementations, the inner surfaces of the jaws are concave shaped in order to accommodate the conductors and to aid in aligning the conductor relative to the non-contact sensing element. The concave of a first jaw may overlap an end of the second jaw, thereby further aiding in the alignment of the conductor relative to the non-contact sensing element.

Figure 1A:
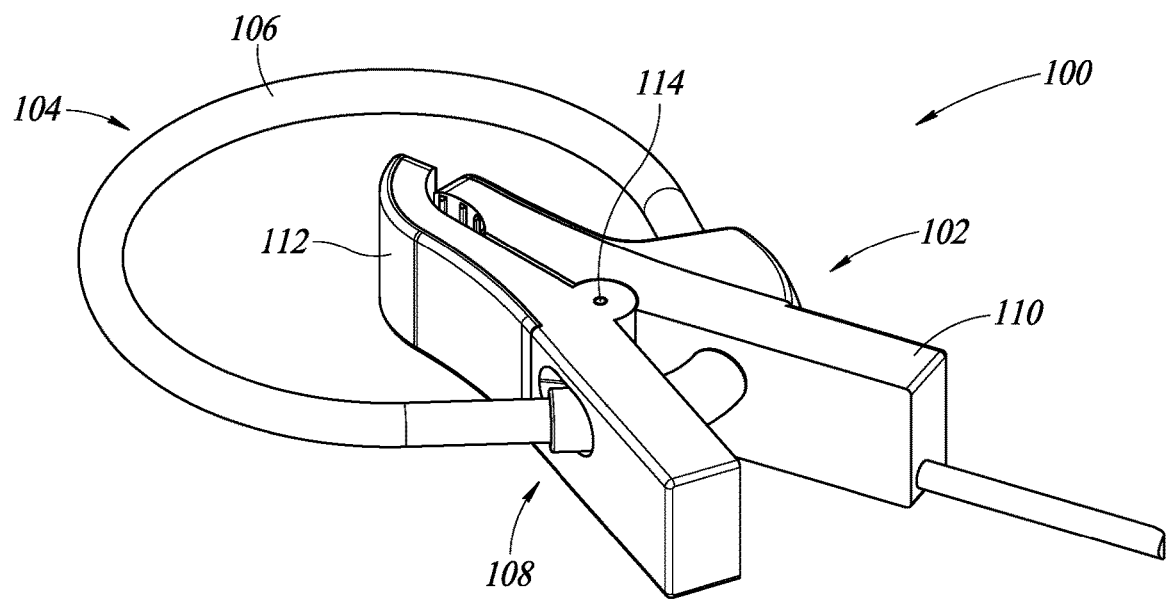
FIG. 1A shows an isometric view of at least one non-limiting embodiment of a sensor probe in a closed position.

In the drawings, identical reference numbers identify similar elements. The sizes and relative positions of elements in the drawings are not necessarily drawn to scale. For example, the shapes of various elements and angles and spaces between elements are not necessarily drawn to scale, and some of these elements may be arbitrarily enlarged and positioned to improve drawing legibility. Further, the particular shapes of the elements as drawn are not necessarily intended to convey information regarding any required shape of the elements, and may have been selected solely for ease of recognition in the drawings.

DETAILED DESCRIPTION

One or more implementations of the present disclosure are directed to sensor probes of measurement systems for measuring a plurality of electrical parameters (e.g., voltage, current) of a conductor, and methods for measuring same. In at least one implementation, the sensor probe integrates a Rogowski coil and a non-contact voltage sensor that are arranged relative to each other such that when positioned to measure a conductor, such as a wire, the Rogowski coil and the non-contact voltage sensor are held in proper position for measurement. Accordingly, a user may be able to be separated from the sensor probe while the sensor probe senses an electrical parameter of the conductor.

In at least one implementation, the sensor probe includes a Rogowski coil that forms a loop and the non-contact sensor comprises a sensor element located on an inner surface of a pair of jaws of a spring loaded clamp. The pair of jaws of the clamp is arranged to hold the conductor under test at a central region of the loop formed by the Rogowski coil so that the conductor is in proper position for testing. More particularly, the pair of jaws of the clamp is arranged relative to the Rogowski coil such that the conductor under test extends perpendicular through a central region of the plane of the loop formed by the Rogowski coil.

In general, it is desirable to have the conductor under test in a center region of the Rogowski coil. That is, locating a conductor to be tested in a center region of the Rogowski coil is an optimum location for accurate current readings. The arrangement of the non-contact sensor and the Rogowski coil optimizes the location of the conductor under test such that the non-contact sensor and the Rogowski coil can continuously take measurements of the conductor under test without continuous user manipulation or intervention.

The jaws of the clamp are configured to hold the conductor under test so that a surface of an insulative material around the conductor under test aligns with and abuts a non-contact sensor element. In some implementations, the inner surfaces of the jaws are concave shaped in order to accommodate the conductors and to aid in aligning the conductor relative to the non-contact sensing element. The concave of a first jaw may overlap an end of the second jaw, thereby further aiding in the alignment of the conductor relative to the non-contact sensing element.

As used herein, a "non-contact" device or sensor is operative to detect an electrical parameter in an insulated conductor without requiring galvanic contact with the conductor. The conductor may be an energized insulated conductor, such as a wire.

In the following description, certain specific details are set forth in order to provide a thorough understanding of various disclosed implementations. However, a person skilled in the art will recognize that additional implementations may be practiced without one or more of these specific details, or with other methods, components, materials, etc.

Additionally, reference throughout this specification to "one embodiment" or "an embodiment" means that a particular feature, structure or characteristic described in connection with the embodiment is included in at least one embodiment. Furthermore, appearance of the phrase "in at least one embodiment" in this specification does not necessarily refer to only one embodiment. The particular features, structures, or characteristics of the various embodiments described herein may be combined in any suitable manner in yet additional embodiments.

FIG. 1A shows an isometric view of at least one non-limiting embodiment of a sensor probe 100 in a closed position. The sensor probe 100 includes non-contact sensor 102 and a Rogowski coil 104. The Rogowski coil 104 includes a conductive loop 106 configured to be placed around a conductor to be tested and to sense an electric field of the conductor while the conductor is energized. The electric field sensed in the conductor is indicative of current flowing through the conductor.

Figure 1B:
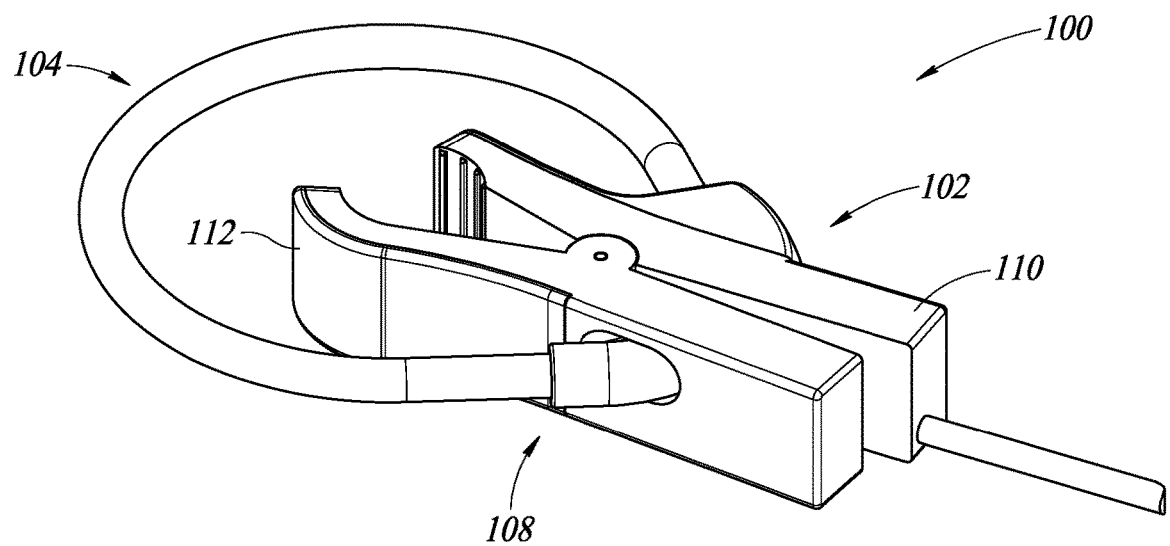
FIG. 1B shows the sensor probe of FIG. 1 in an open position.
Figure 1C:
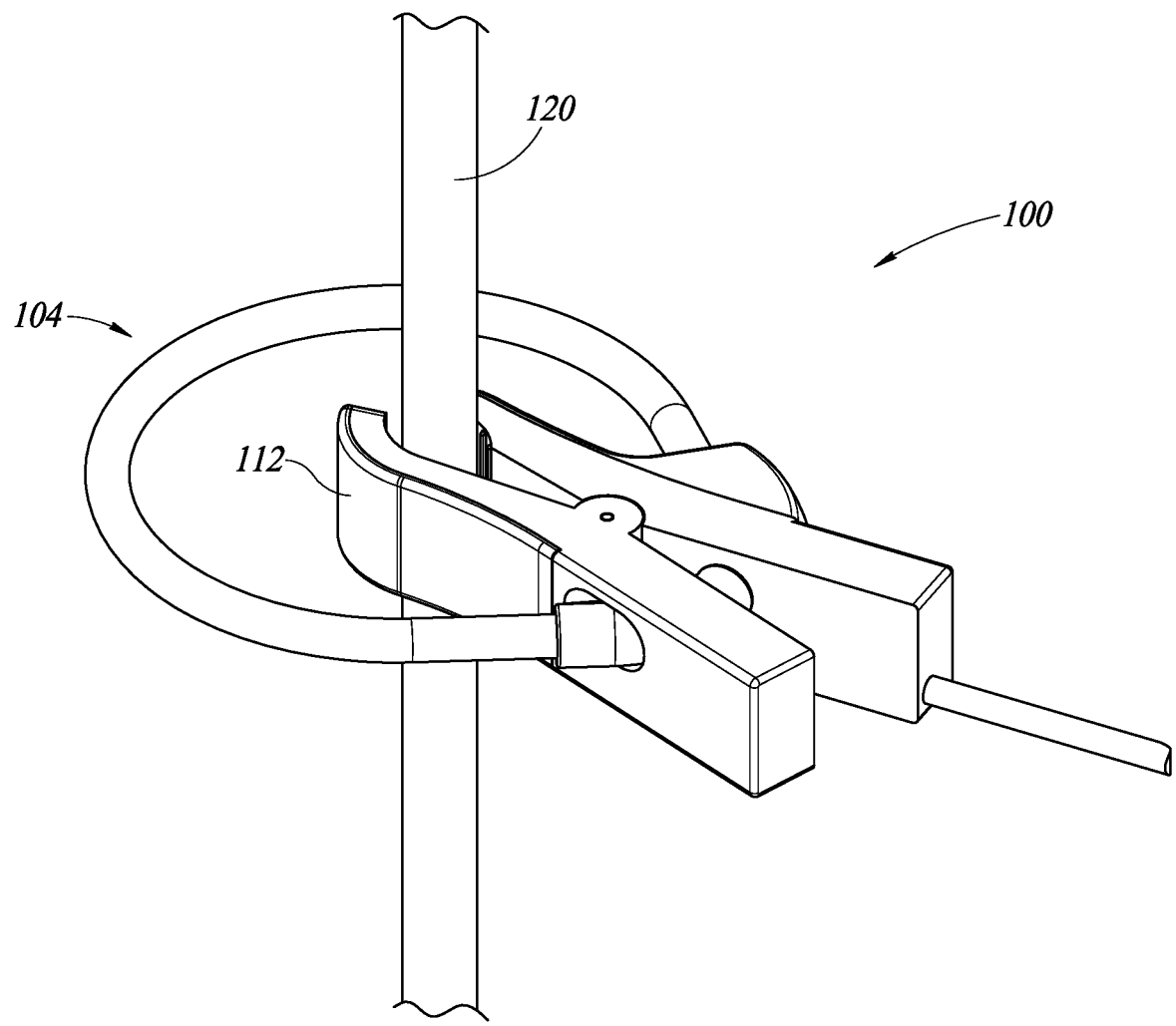
FIG. 1C shows the sensor probe of FIG. 1 holding a wire.
Figure 1D:
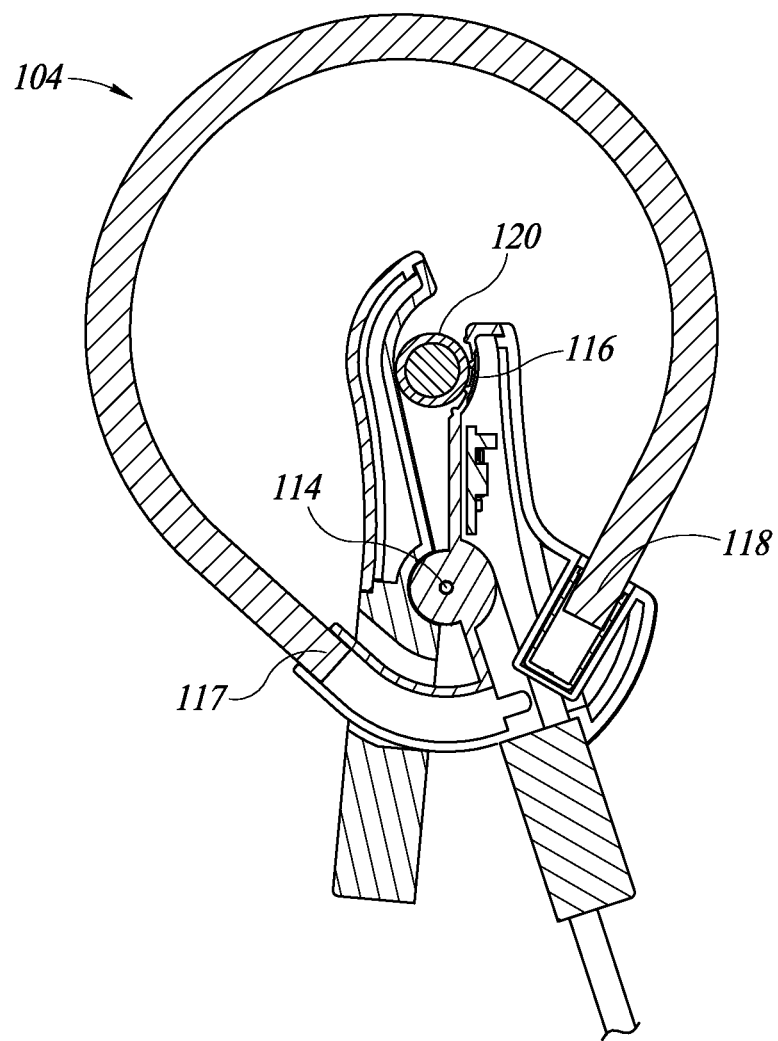
FIG. 1D shows the sensor probe of FIG. 1 in plan view and in cross section.

The non-contact sensor 102 includes a spring loaded clamp 108 having a handle portion 110 and a jaw portion 112. The handle portion 110 and the jaw portion 112 are configured to move relative to each other about a pivot point 114. The jaw portion 112 includes a pair of jaws arranged in a central region of the Rogowski coil 104. A surface of one jaw of the pair of jaws includes a non-contact sensing element 116 (FIG. 1D). The non-contact sensing element 116 does not require a galvanic connection with the conductor to measure the electrical parameter. The non-contact sensing element 116 is configured to sense a voltage of the conductor.

The handle portion 110 of the spring loaded clamp 108 is coupled to the Rogowski coil 104. More particularly, the handle portion 110 of the spring loaded clamp 108 forms a portion of the Rogowski coil 104, such as sockets for receiving leads of the Rogowski coil 104.

As best shown in FIG. 1A, in a resting position, the pair of jaws of jaw portion 112 are held in a closed position by a spring (not shown). To place the pair of jaws in an open position as best shown in FIG. 1B, a user presses handles of the handle portion 110 together, thereby counteracting the spring that holds the pair of jaws closed. The pair of jaws of jaw portion 112 move in a plane of the Rogowski coil. The pair of jaws of jaw portion 112 move in opposing directions from each other and are displaced by a same amount. The location of the pair of jaws aid in placing the conductor to be test in a central area of the loop of the Rogowski coil.

While the pair of jaws is in the open position, a conductor 120, such as a wire, may be placed therebetween. In response to releasing the handle portion 110, the spring of the spring loaded clamp 108 causes the pair of jaws of the jaw portion 112 to close, and thereby secure or clamp to the conductor 120. FIG. 1C shows jaw portion 112 of the sensor probe 100 of FIG. 1A holding a wire. As shown in FIG. 1C, the jaw portion 112 of the spring loaded clamp 108 is arranged such that the conductor under test extends perpendicularly through a central region of the loop of the Rogowski coil. The central region includes more than a central point of the loop. In fact, the jaw portion 112 may be in the central region while also being offset from the central point of the loop. Generally described, the central region includes approximately 30% of area inside of the loop about the center point thereof. The spring loaded clamp 108 aids in placing the conductor under test in a proper position relative to the Rogowski coil 104.

As best shown in FIG. 1D, an inner surface of one jaw of the pair of jaws includes the non-contact sensing element 116. The non-contact sensing element 116 abuts the insulated portion of the conductor 120 and senses an electrical parameter, such as voltage, of the conductor 120. That is, the clamp holds the conductor 120 such that a non-contact sensor of the sensing probe is placed within a threshold distance to the wire. The threshold distance is any distance that allows the non-contact sensor element to measure an electrical parameter, such as voltage, of the conductor. In some embodiments, the threshold distance may be a distance that causes the insulative material of the conductor to abut the non-contact sensor element of the non-contact sensor.

In some embodiments, the position of the pivot point 114 of the spring loaded clamp 108 may be tangential to the loop 106 formed by the Rogowski coil 104, thereby positioning the jaws in a central area of the loop of the Rogowski coil 104, as well as positioning the jaws so that the inner surface of the jaws, such that the non-contact voltage sensor element 116, is aligned with the conductor.

In various embodiments, the non-contact sensing element 116 on an inner surface of one of the jaws of the jaw portion 112 is a non-contact voltage sensor, a non-contact current sensor, a Hall Effect element, a current transformer, a fluxgate sensor, an anisotropic magnetoresistance (AMR) sensor, a giant magnetoresistance (GMR) sensor, or other types of sensors operative to sense an electrical parameter of the insulated conductor without requiring galvanic contact.

Inner surfaces of the jaws are concave shaped in order to accommodate the conductors and to aid in aligning the conductor relative to the non-contact sensing element 116. In the illustrated embodiment as best shown in FIG. 1A, the concave of a first jaw overlaps an end of the second jaw, thereby further aiding in the alignment of the conductor relative to the non-contact sensing element 116 as best shown in FIG. 1D. That is, the first jaw is longer than the second jaw and curls toward the second jaw. The overlap of the first jaw may prevent the conductor from slipping away during clamping. Further, the opening formed by the curvature of the concave of the first and second jaws, along with the spring of the spring loaded clamp, pushes the conductor held therein against non-contact sensing element 116.

The jaws of the non-contact sensor 102 are configured to accommodate various sized conductors. In one embodiment, the jaws are configured to accommodate diameters from about 6 millimeters (mm) to about 20 mm. Accordingly, the jaws are configured to open wider than 20 mm in order to receive and hold a conductor of 20 mm.

The Rogowski coil 104 includes a conductive material having first and second ends that form first and second leads 117, 118. Although not shown, an insulative material may surround the exposed portion of the conductive material of the Rogowski coil 104. The first and second leads 117, 118 are received into sockets that are operatively coupled to the sensing head 122. In one embodiment, the first lead 117 is permanently fixed to the socket, and the second lead 118 is removable from the respective socket. That is, the first lead 117 is not removable from the socket in order to position the Rogowski coil 104 in position during use, while the second lead 118 is removable from the respective socket so that the Rogowski coil 104 can be placed in position during use.

In another embodiment, both the first and second leads 117, 118 are removable from the sockets. Accordingly, the Rogowski coil 104 may be completely separated from the rest of the sensor probe 100 and placed around a conductor to be tested that is under tight space constraints and then secured again into the sockets of the sensor probe 100.

To place the Rogowski coil 104 around a conductor 120 to be tested, the second lead 118 may be removed from the socket and the conductor 120 is slide between the opening formed by the first lead 117 and the socket. The jaws of the non-contact sensor 102 are clamped to the conductor 120. The second lead 118 may be placed by into the socket.

The location of the conductor under test relative to the Rogowski coil 104 is important for obtaining accurate measurements. The Rogowski coil 104 may be made of a material that is sufficiently rigid such that it is to be held in position around the conductor 120. That is, while the jaws of the spring loaded clamp 108 hold the conductor 120 under test, the Rogowski coil 104 surrounds the conductor 120. The relative position of the Rogowski coil 104 to the non-contact sensor 102 optimizes the placement of the conductor 120 while the conductor is being held by the jaws of the non-contact sensor 102.

The non-contact sensing element 116 of the non-contact sensor is configured to measure an electrical parameter, such as voltage, of the energized conductor under test, while at the same time the Rogowski coil 104 is configured to measure another electrical parameter, such as current, of the energized conductor under test. Accordingly, the sensor probe 100 is configured to make continuous measurements using both the non-contact sensor 102 and the Rogowski coil 104 without intervention or manipulation by the user.

Figure 2:
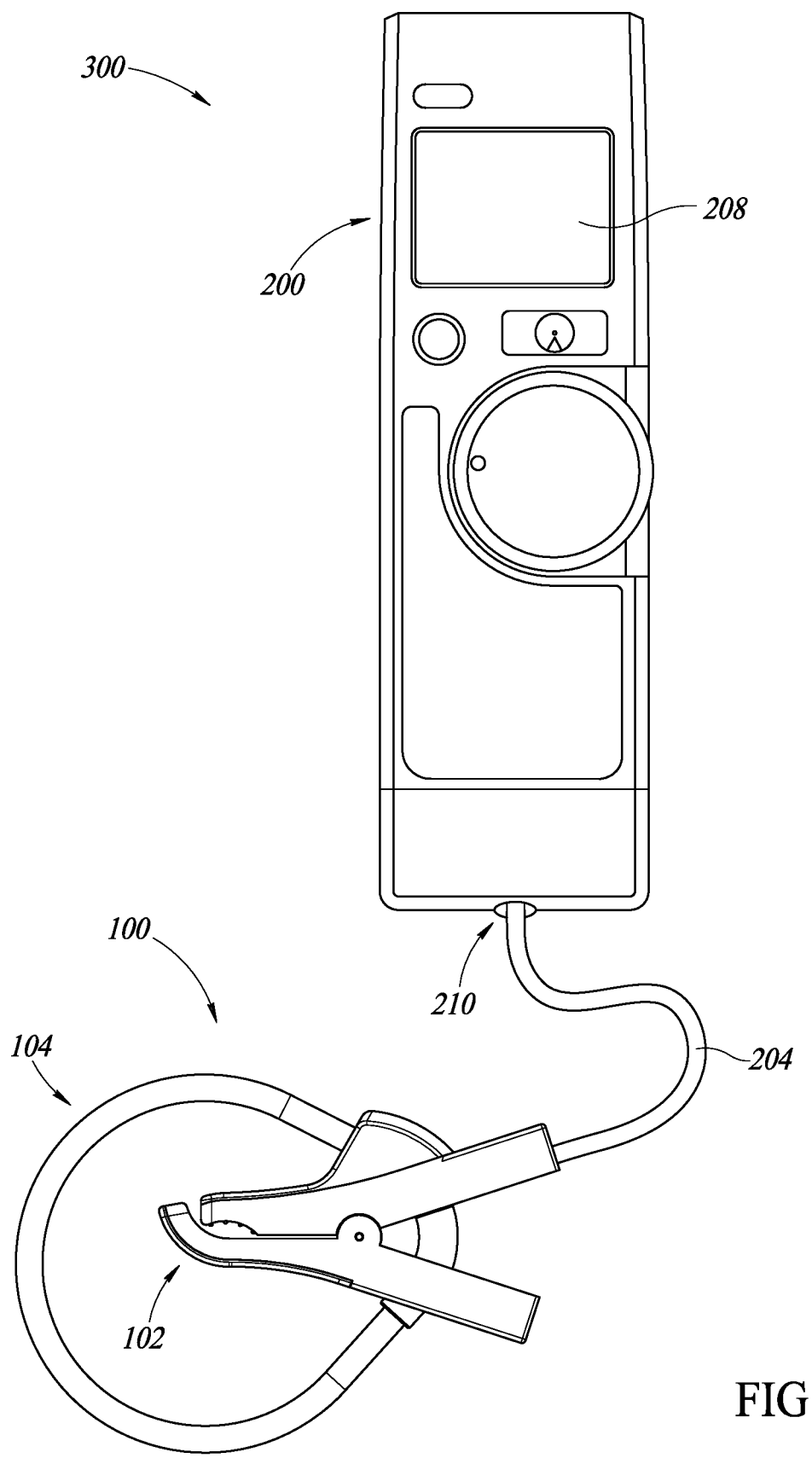
FIG. 2 shows at least one non-limiting embodiment of a measurement system comprising the sensor probe of FIG. 1 coupled to a measurement instrument.

FIG. 2 shows a measurement system 300 comprising the sensor probe 100 of FIG. 1 coupled to a measurement instrument 200 by a wire 204 as shown, or alternatively by a wireless connection. The measurement instrument 200 may be any suitable measurement instrument configured to communicate with the sensor probe 100. Accordingly, the non-contact sensor 102 and Rogowski coil 104 of the sensor probe 100 are operatively coupled to the measurement instrument 200. For instance, the sensor probe 100 and the measurement instrument 200 may be configured to send and receive signals therebetween. The measurement instrument 200 includes a housing, a user interface including a display 208, and at least one interface connector 210 for coupling with the wire 204 of the sensor probe. The sensing head 122 of the sensor probe 100 is operatively coupled to the measurement instrument 200 to provide and receive one or more signals therebetween. The sensing head 122 of the sensor probe may further include circuitry, such as amplify, process, or control.

Figure 3:
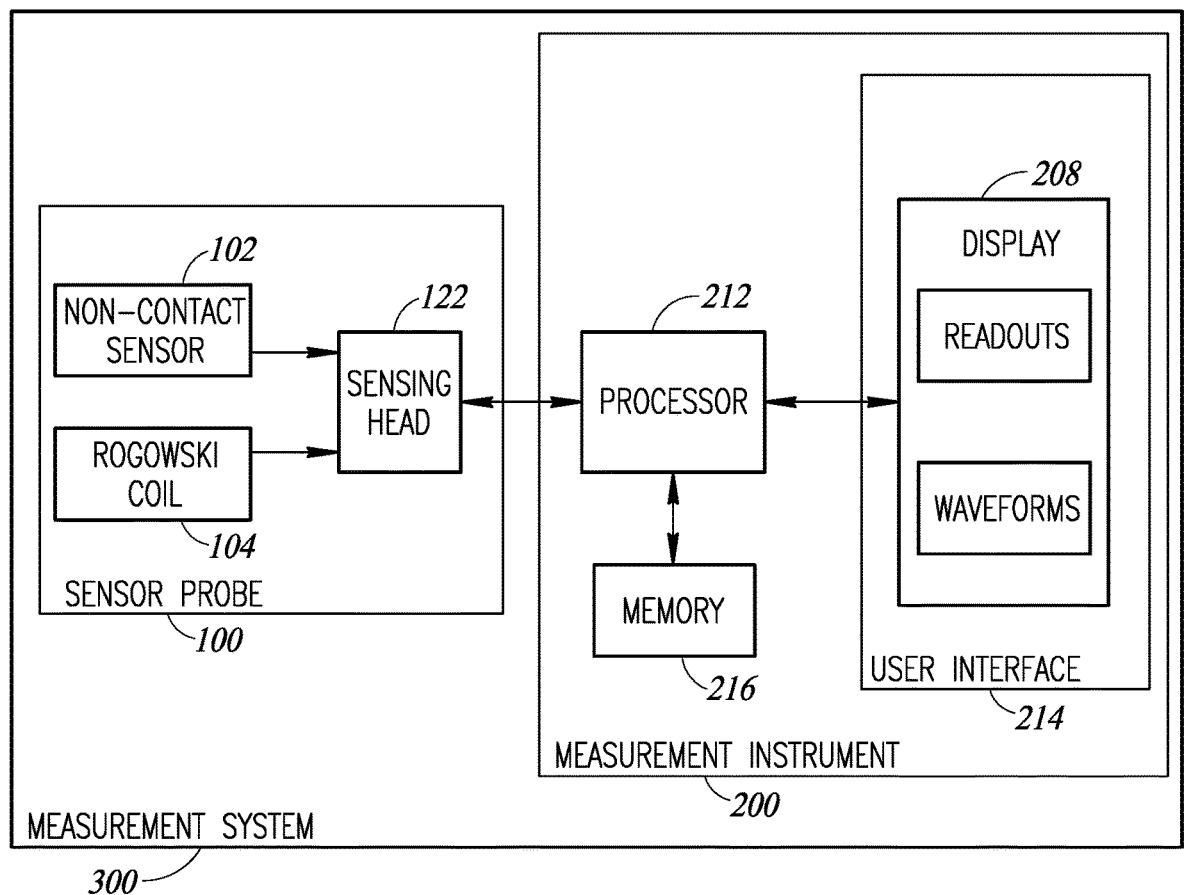
FIG. 3 shows at least one non-limiting embodiment of block diagram of the electrical components of the measurement system of FIG. 2.

FIG. 3 shows a block diagram of the electrical components of a measurement system 300, which includes the measurement system 300 of FIG. 2 and the sensor probe 100. As discussed above, the sensor probe 100 includes the non-contact sensor 102 and the Rogowski coil 104 operatively coupled to the sensor head 122, which is operatively coupled to the measurement instrument 200.

The sensor probe 100 includes one or more sensor heads 122 operatively coupled to the non-contact sensor 102 and Rogowski coil 104. In the illustrated embodiment, there is one sensor heads 122. The sensor head may be located in the handle member 128 of the non-contact sensor 102. The one or more sensor heads 122 may include circuitry process, such as amplify, control, etc., and for sending signals between the non-contact sensor 102 and Rogowski coil 104 and a measurement instrument 200. In some implementations, the sensor head 122 does not include further circuitry and operatively couples the non-contact sensor 102 and Rogowski coil 104 of the sensor probe to the wire 204 and the measurement instrument 200.

The measurement instrument 200 includes processing and/or control circuitry 212, a user interface 214, which includes the display 208, and memory 216. The user interface 214, including the display 208, provides measurement results and other information to the user. The user interface 214 is further configured to receive user input information such as measurement instructions or other information. The display 208 may provide readouts and waveforms indicative of the measurements received from the sensor probe 100 for communicating to the user. The display 208 may be a display of any suitable type, such as a liquid crystal display (LCD), a light-emitting diode (LED) display, an organic LED display, a plasma display, or an e-ink display. The user interface 214 may include various inputs and outputs, include audio, visual, touch screen, buttons, knobs, wheels, etc.

The processing and/or control circuitry 212 of the measurement instrument 200 includes circuitry for sending, receiving, and processing signals to and from the sensing head 122 of the sensor probe 100. The processing and/or control circuitry 212 of the measuring instrument 200 is operative to send control signals to, as well as receive and process measurement signals received from, the sensing head 122 and/or directly from the non-contact sensor 102 and/or the Rogowski coil 104. The processor and/or control circuitry 212 may process the received signals and outputting signals to the user interface 214. The receive signals may include signals indicative of electrical parameters, such voltage and current. The processor and/or control circuitry 212 may be configured to determine one or more electrical parameters, such as power or phase angle. The processing and/or control circuitry 212 may additionally or alternatively include conditioning or conversion circuitry that is operative to condition or convert the signals into a form receivable by another measuring instrument, such as an analog form (e.g., 0-1 V) or a digital form (e.g., 8 bits, 16 bits, 64 bits). The control circuitry may include one or more processors (e.g., microcontroller, DSP, ASIC, FPGA), one or more types of memory (e.g., ROM, RAM, flash memory, other nontransitory storage media), and/or one or more other types of processing or control related components.

In some implementations, the measurement instrument 200 is configured for wireless communication to another instrument. The wireless communication may include a wireless communications subsystem such as a Bluetooth® module, a Wi-Fi® module, a ZIGBEE® module, a near field communication (NFC) module, etc. The measuring instrument may be operative to communicate wirelessly via the wireless communications subsystem with an external system, such as a computer, smart phone, tablet, personal digital assistant, etc., so as to transmit measurement results to the external system or to receive instruction signals or input information from the external system. The measuring instrument may additionally or alternatively include a wired communications subsystem, such as a USB interface, etc.

Although not shown, the measurement instrument 200 includes a power supply, such as a battery or battery pack, for supplying power to the various electrical components of the measurement instrument 200 and the sensor probe 100, or includes an output for coupling to an external power supply.

In use, the jaws of the spring loaded clamp 108 of the sensor probe 100 hold the conductor 120 under test, while the Rogowski coil 104 surrounds the conductor 120 as shown in FIG. 1D. The Rogowski coil 104 is placed around the conductor 120 under test by removing one of the first and second leads 117, 118, such as the second lead 118, from the socket so that the conductor 120 can slide between the second lead 118 and the socket. The Rogowski coil is configured to sense the magnetic field generated by the energized conductor for measuring the current in the conductor. The location of the conductor under test relative to the Rogowski coil 104 is important for obtaining accurate measurements. The electrical parameters, such as current and voltage, measured by the sensor probe 100 are provided to the measurement instrument 200. In at least one implementation, the Rogowski coil 104 measures current of a conductor under test, and the non-contact sensor measures voltage of the conductor under test.

Figure 4A:
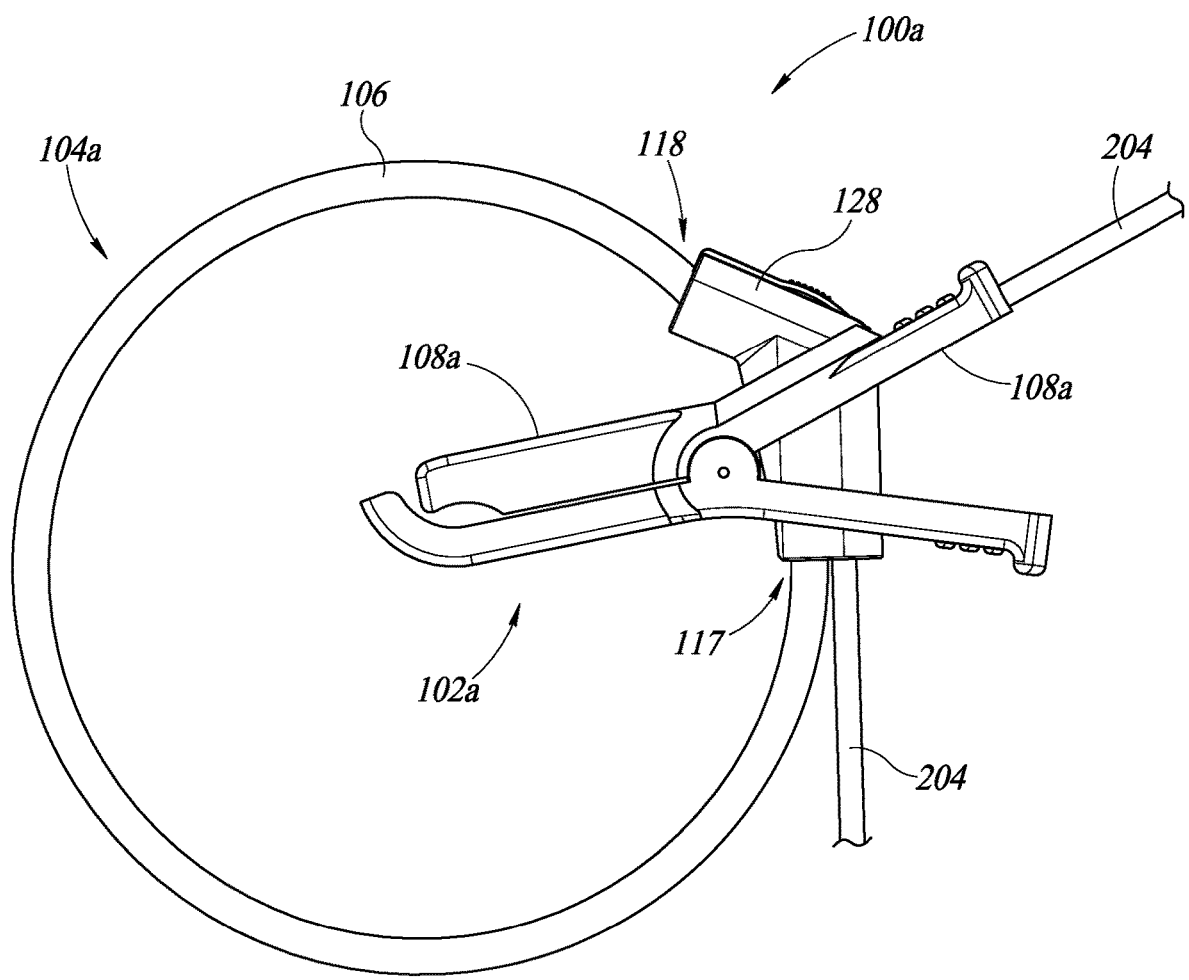
FIG. 4A shows an isometric view of at least one non-limiting embodiment of a sensor probe combination.
Figure 4B:
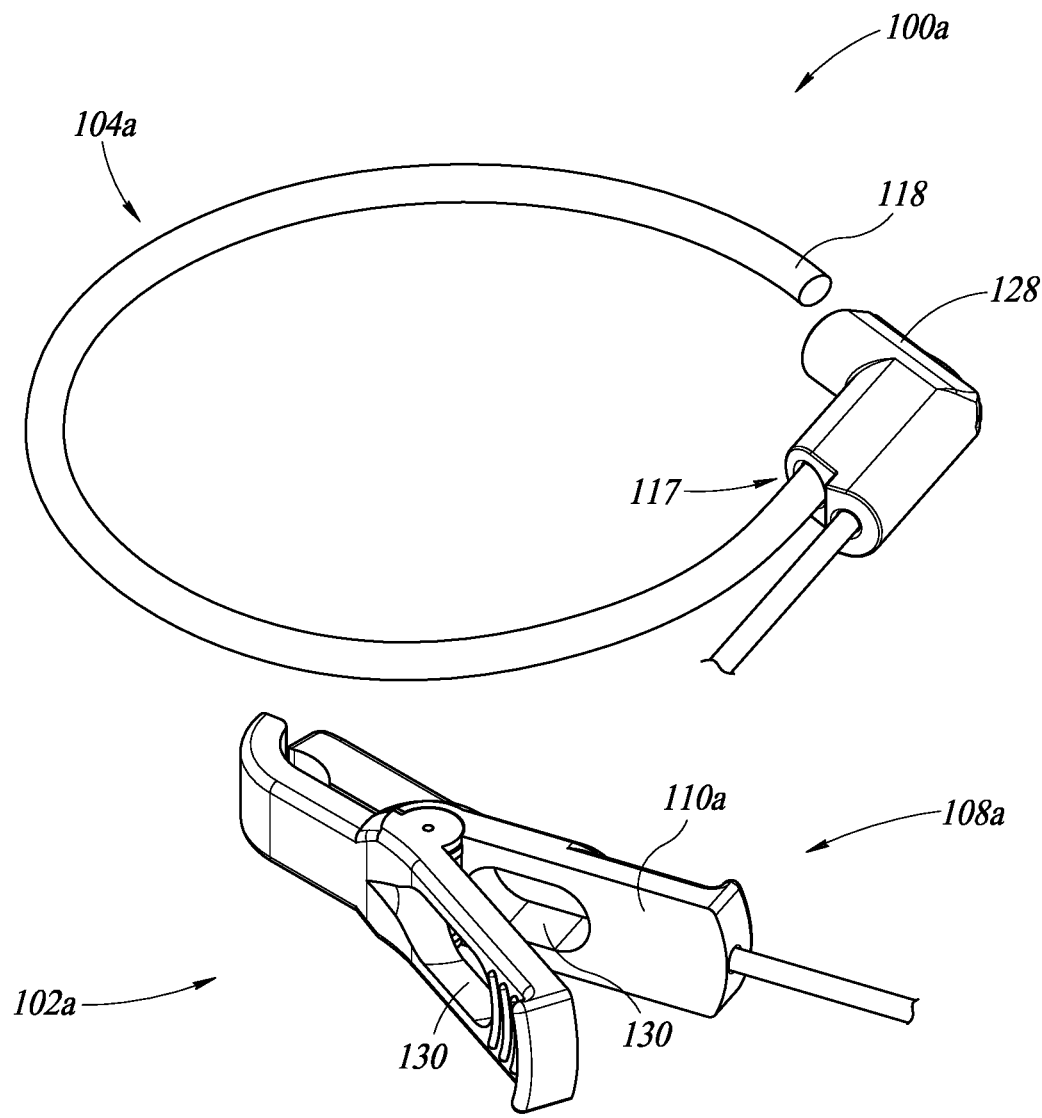
FIG. 4B shows the sensor probe combination of FIG. 1 in a separated state.

FIGS. 4A and 4B show a sensor probe 100a in accordance with another embodiment. The sensor probe 100a includes a Rogowski coil 104a and a non-contact sensor 102a. The Rogowski coil 104a is substantially the same as Rogowski coil 104 of the sensor probe 100 of FIG. 1A, except that the Rogowski coil 104a includes a handle member 128 that is distinct from the non-contact sensor 102a. Furthermore, the Rogowski coil 104a of the sensor probe 100a is configured to be separated from the non-contact sensor 102a. The non-contact sensor 102a is substantially similar to the non-contact sensor 102 of FIG. 1A. Only the differences between the sensor probe 100a and the sensor probe 100 will be discussed in the interest of brevity.

The sensor probe 100a is configured so that the Rogowski coil 104a can be separated from the non-contact sensor 102a. Accordingly, both the Rogowski coil 104a and the non-contact sensor 102a are individually coupled to the measurement instrument 200 by separate wires 204.

The handle member 128 of the Rogowski coil 104a includes respective sockets for receiving the first and second leads 117, 118. The shape of the handle member 128 comprising the sockets for receiving the first and second leads 117, 118 corresponds to the shape of the conductive loop 106. In the illustrated embodiment, the handle member 128 has a first portion that is bent relative to a second portion. In another implementation, the handle member 128 may have a curved shaped that substantially corresponds to the curvature of the Rogowski coil 104a.

The first lead 117 may be fixed to the socket of the handle member 128, while the second lead 118 may be removably fixed to the socket of the handle member 128. FIG. 4B shows the second 118 lead removed from the socket of the handle member 128. In another embodiment, the second lead 118 may be fixed to the socket of the handle member 128, while the first lead 117 may be removably fixed to the socket of the handle member 128, or both leads may be removably fixed.

The spring loaded clamp 108a, although not identical in structure, is substantially the same as the spring loaded clamp 108 of FIG. 1A. The handle portion 110 of the non-contact sensor 102a is removably coupled to the handle member 128 of the Rogowski coil 104a. With reference to FIG. 4B, the handle portion 110a of the non-contact sensor includes through openings 130 that fit through the handle member 128 of the Rogowski coil 104a and secure the non-contact sensor 102a to the Rogowski coil 104a.

Figure 5A:
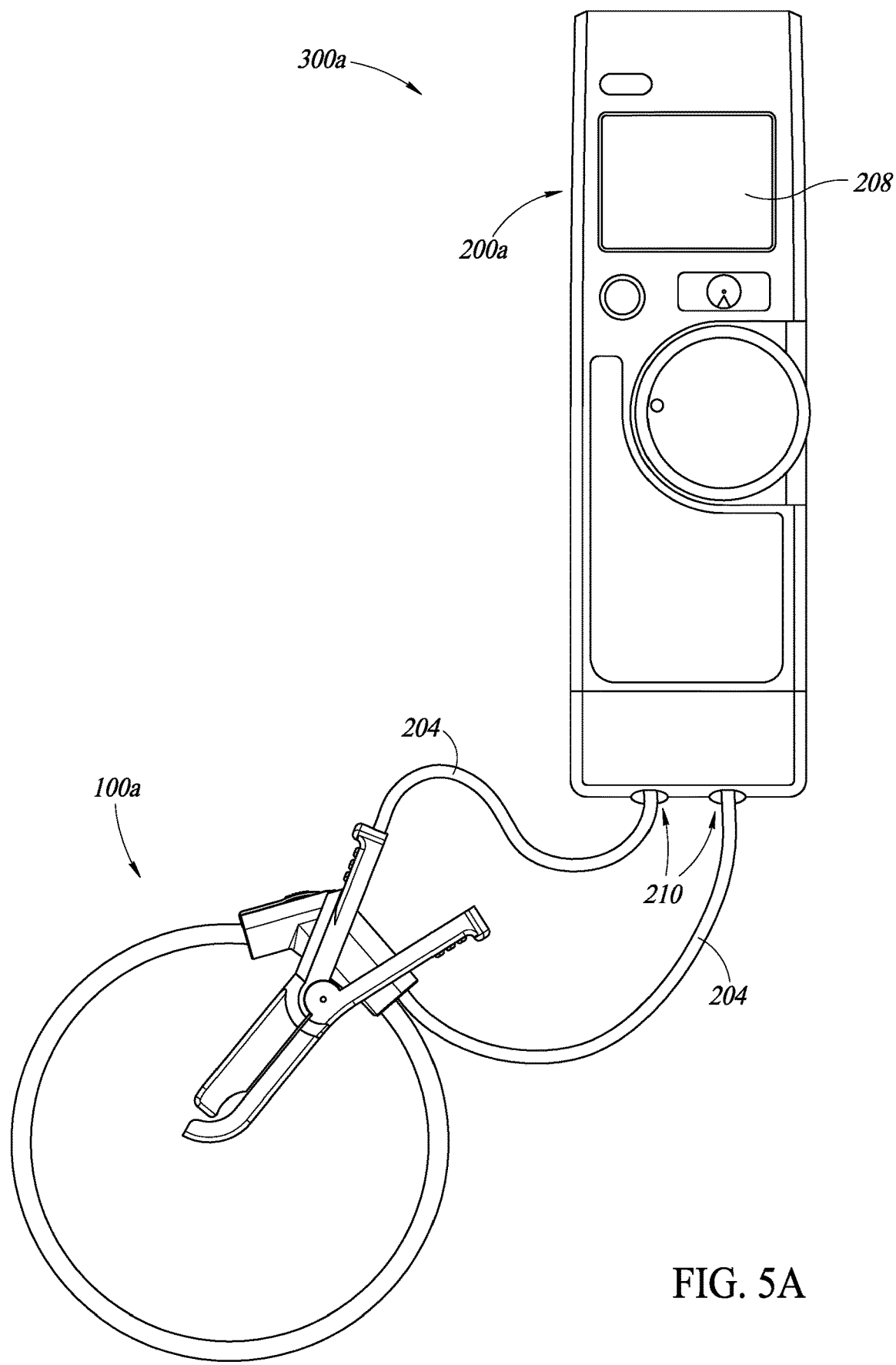
FIG. 5A shows at least one non-limiting embodiment of a measurement system comprising the sensor probe combination of FIG. 4A coupled to a measurement meter.
Figure 5B:
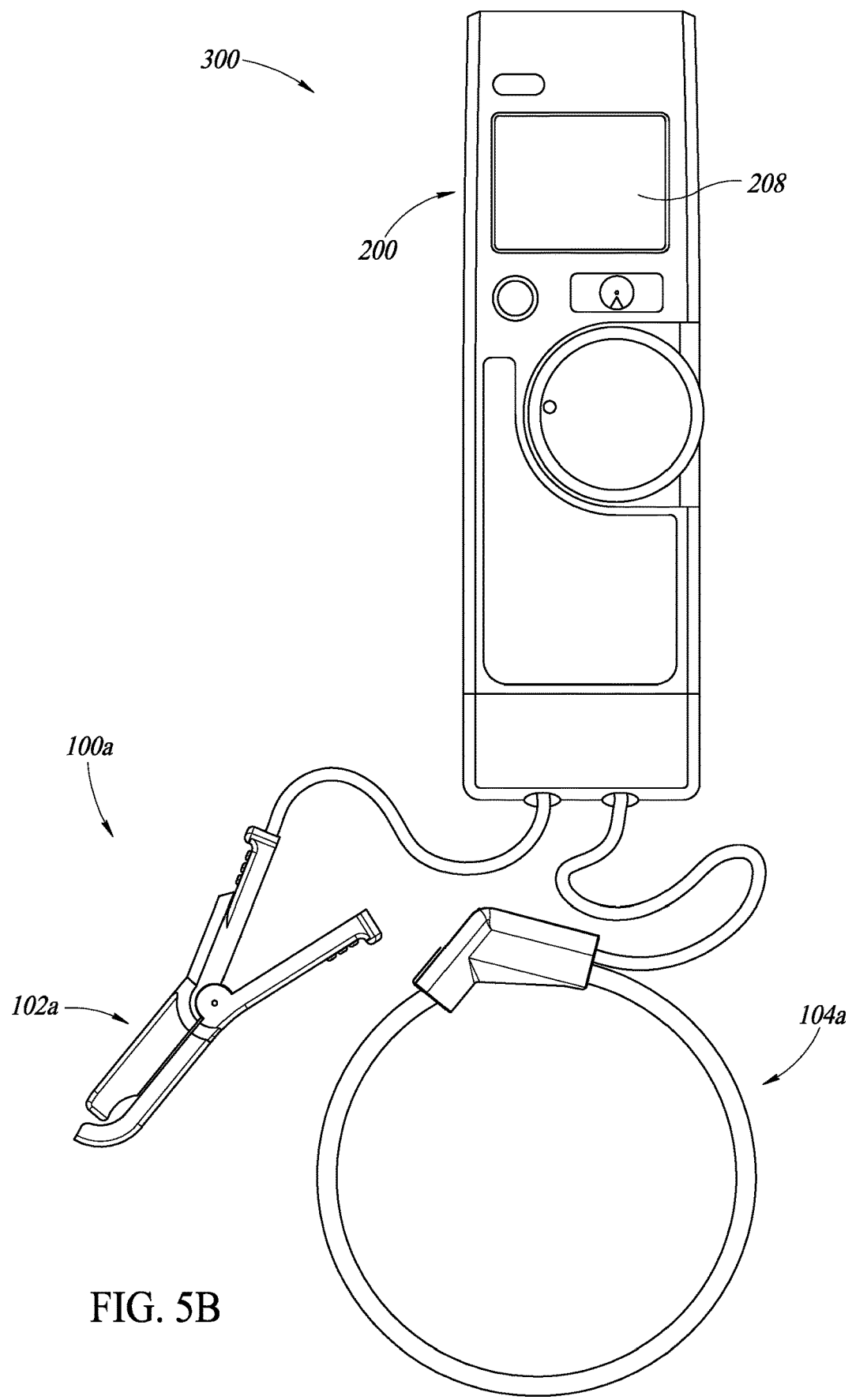
FIG. 5B shows at least one non-limiting embodiment of a measurement system comprising the sensor probe combination of FIG. 4B in the separated state and coupled to a measurement meter.

FIG. 5A shows a measurement system 300a that includes the sensor probe 100a coupled to a measurement instrument 200a by respective wires 204 and shows the non-contact sensor 102a to the Rogowski coil 104a of the sensor probe 100a coupled together in a coupled state. FIG. 5B shows the measurement system 300a with the non-contact sensor 102a and the Rogowski coil 104a of the sensor probe 100a decoupled from each other in a decoupled state. The sensor probe 100a of the measurement system 300a is able to make measurements with the non-contact sensor 102a and the Rogowski coil 104a in the combined state as shown in FIG. 5A, as well in the decoupled state as shown in FIG. 5B.

Figure 6:
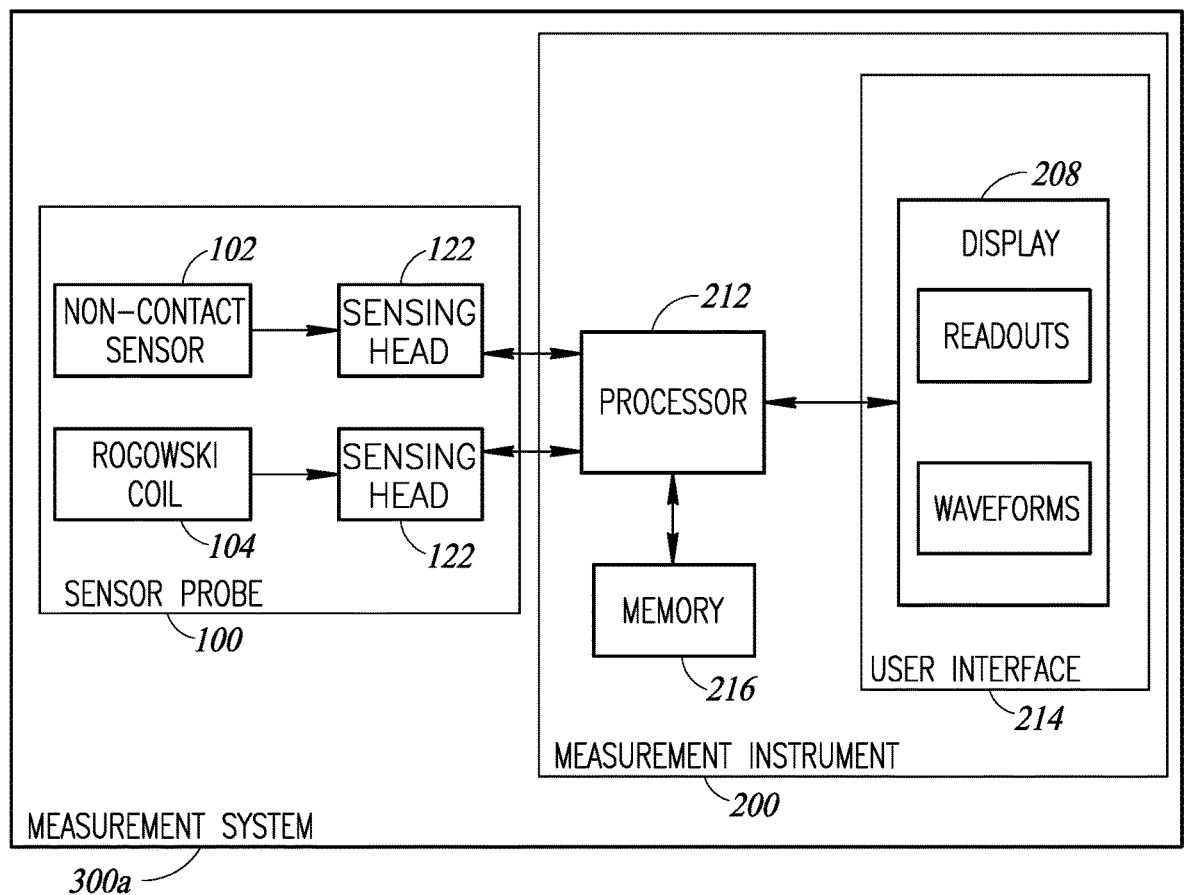
FIG. 6 shows at least one non-limiting embodiment of block diagram of the electrical components of the measurement system of FIG. 5A.

FIG. 6 shows a block diagram of the electrical components of a measurement system 300a, which includes the measurement system 300 and the sensor probe 100a. The block diagram of the electrical components of a measurement system 300a of FIG. 6 has the same components configured to perform the same function as the block of the electrical components of a measurement system 300 of FIG. 3 discussed above, except that the non-contact sensor 102a and the Rogowski coil 104a are coupled to respective sensing heads 122. That is, the non-contact sensor 102a is coupled to a sensing head 122 in the handle portion 110a of the non-contact sensor 102a, and the Rogowski coil 104a is coupled to a sensing head 122 in the handle member 128 of the Rogowski coil 104a. Thereby, the sensing head 122 of the non-contact sensor 102a has a first communication line to the measurement instrument 200, and the sensing head 122 of the Rogowski coil 104a has a second communication line to the measurement instrument 200.

Figure 7:
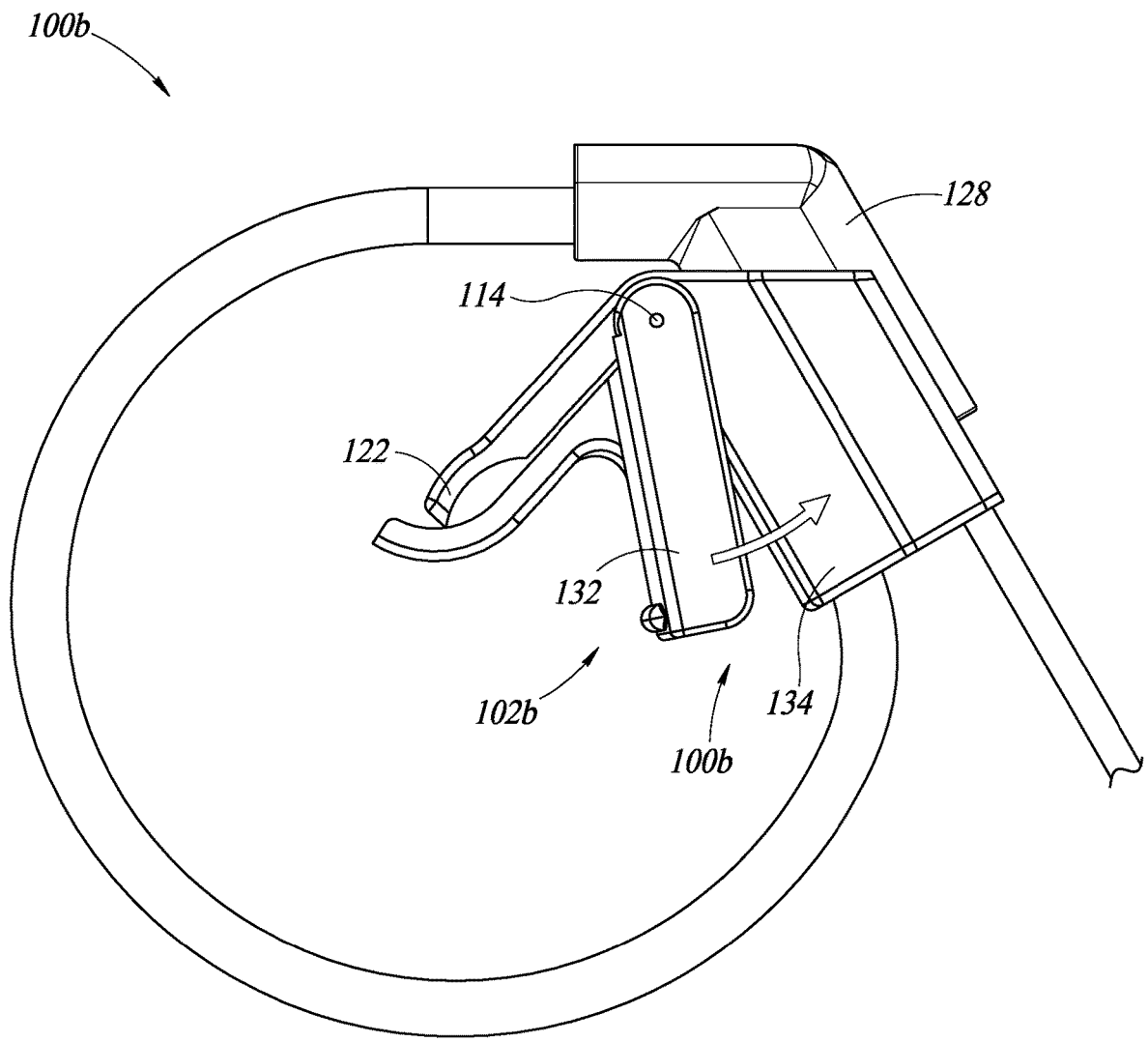
FIG. 7 shows plan view at least one non-limiting embodiment of a sensor probe.

FIG. 7 shows a sensor probe 100b in accordance with yet another embodiment. The sensor probe 100b is substantially similar in structure and function as the sensor probe 100a of FIG. 4A, except for the non-contact sensor 102b. Only the differences between the non-contact sensor 102b and the non-contact sensor 102a or non-contact sensor 102 will be discussed in the interest of brevity.

The jaw portion 112 of the non-contact sensor 102b are the same in structure and function as the jaw portion 112 of the sensor probe 100a. The handle portion 110b, however, is different from the handle portions 100 of FIG. 1A and 100a of FIG. 4A. The handle portion 100b engages the jaw portion 112 by moving a first handle member 132 relative to a second handle member 134. That is, when the first handle member 132 is moved toward the second handle member 134 in the direction indicated by the arrow, the jaws separate from each other. Upon release of the first handle member 132, the spring of the non-contact sensor 102b causes the jaws to move toward each other. If a conductor to be tested is placed between the jaws prior to releasing the first handle member 132, the jaws clamp onto the conductor to be tested. In this implementation, the pivot point 114 between the jaws and the handle portion 100b is arranged substantially tangential to the loop of the Rogowski coil 104a.

In general, the Rogowski coil 104a is the same as the Rogowski coil 104a, however, the handle member 128 of the Rogowski coil 104a is operatively coupled to the non-contact sensor 102b so that signals from the non-contact sensor 102b are communicated to the sensing head 122.

Figure 8:
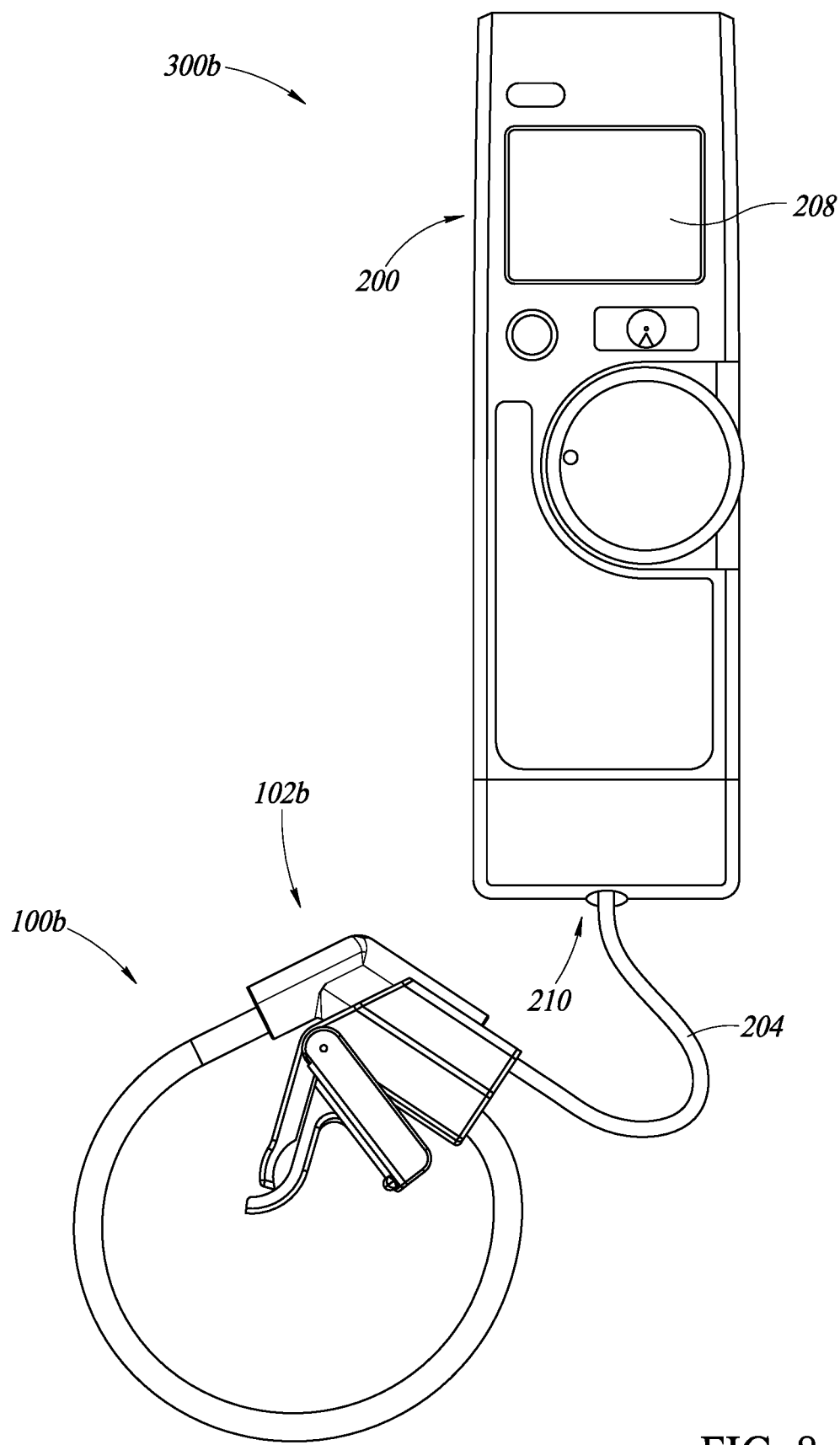
FIG. 8 shows at least one non-limiting embodiment of a measurement system comprising the sensor probe of FIG. 7 coupled to a measurement meter.

FIG. 8 shows a measurement system 300b that includes the sensor probe 100b coupled to the measurement instrument 200 by a wire 204 at the interface connector 210. Although the sensor probe 100b includes a single wire 204 for coupling to a measurement instrument 200, in other implementations the sensor probe 100b may be coupled to the measurement instrument 200 by two wires such that the non-contact sensor 102 is directly coupled to the measurement instrument 200 and the Rogowski coil 104a is directly and separately coupled to the measurement instrument 200 such as is shown in the embodiment of FIGS. 5A and 5B.

Figure 9:
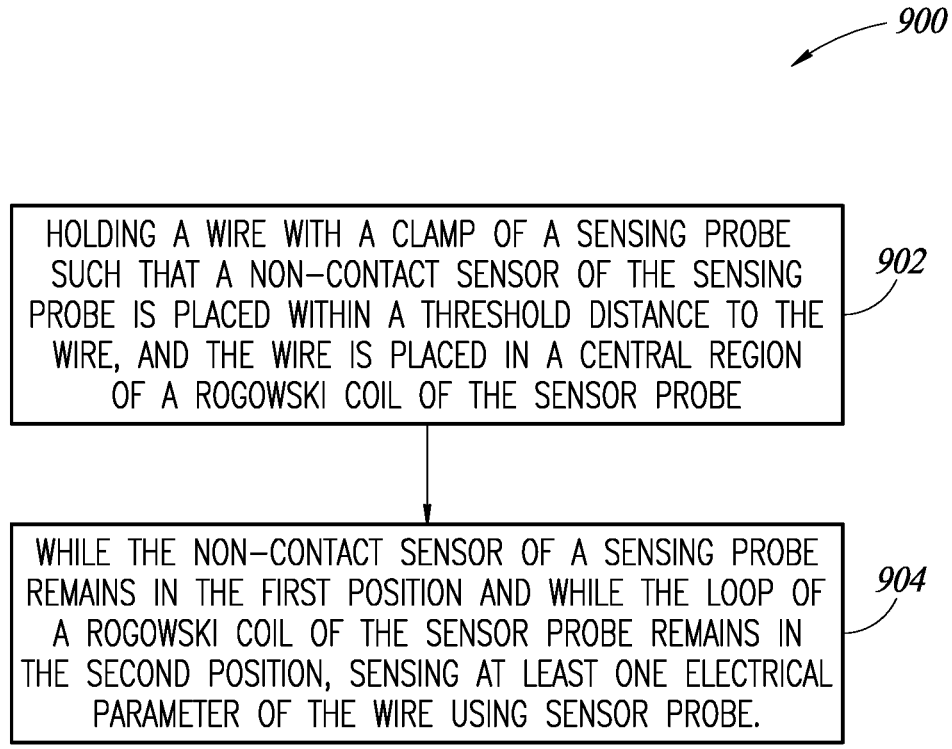
FIG. 9 shows a method of using one or more measurement instruments in accordance with at least one embodiment.

FIG. 9 shows a method 900 of using the measurement systems 300, 300a, and 300b in accordance with at least one embodiment. The method 900 includes holding a wire with a clamp of a sensing probe such that a non-contact sensor of the sensing probe is placed within a threshold distance to the wire, and the wire is placed in a central region of a Rogowski coil of the sensor probe as shown by block 902, and while the non-contact sensor of a sensing probe remains in the first position and while the loop of a Rogowski coil of the sensor probe remains in the second position, sensing at least one electrical parameter of the wire using sensor probe as shown by block 904.

In view of the foregoing disclosure, various examples of a sensor probe or a measurement system may include any one or combination of the following features: a Rogowski coil that forms a loop having first and second leads at opposing ends of the loop, the loop having a central region configured to receive a conductor to be tested.

A non-contact sensor coupled to the Rogowski coil, the non-contact sensor including a non-contact sensor element and a clamp having a pair of clamping jaws, the pair of clamping jaws being configured to hold a conductor, wherein the non-contact sensor element is configured to press against the conductor to sense an electrical characteristic of the conductor.

The sensor probe or the measurement system may include another feature, such as the clamp of the non-contact sensor is permanently coupled to the Rogowski coil.

The sensor probe or the measurement system may include another feature, such as the clamp being configured to hold the conductor in the central region of the loop formed by the Rogowski coil. The central region of the loop is approximately 30% of an area inside of the loop, and may be centered about a center point of the area inside of the loop.

The sensor probe or the measurement system may include another feature, such as further comprising one or more sensing heads configured to receive signals from the Rogowski coil and the non-contact sensor.

The sensor probe or the measurement system may include another feature, such as the pair of jaws is concave shaped, wherein a first jaw is longer than the second jaw.

The sensor probe or the measurement system may include another feature, such as the pair clamping jaws being arranged to be displaced by a same amount when moved between the closed position, the open position, and the holding position.

The sensor probe or the measurement system may include another feature, such as the one or more sensing heads comprising first and second sensing heads. The first sensing head being operatively coupled to the Rogowski coil, and the second sensing head being operatively coupled to the non-contact sensor. More sensing heads may provide improved performance by achieving less conductive travel distance between the sensor and the sensing head. Accordingly, fewer external influence factors, such as wires close by, capacitive stray fields, etc., can influence the measurement signal and higher magnitudes of measurement signal may be realized, thereby resulting in better accuracy.

The sensor probe or the measurement system may include another feature, such as the non-contact sensor being configured to be separated from the Rogowski coil in a separated state, wherein the non-contact sensor and the Rogowski coil are operable in the separated state.

The sensor probe or the measurement system may include another feature, such as the non-contact sensor being configured to be separated from the Rogowski coil.

The sensor probe or the measurement system may include another feature, such as the first lead being permanently fixed to a first socket, and the second lead being configured to be removably fixed to the second leads.

In view of the foregoing disclosure, various examples of a sensor probe or measurement system may include any one or combination of the following features: a sensor probe or a measurement system, comprising a sensor probe configured to sense an electrical parameter in a conductor. The sensor probe includes a Rogowski coil having first and second leads at opposing ends, the Rogowski coil having a central region configured to receive a conductor to be tested. The sensor probe further includes a non-contact sensor coupled to the Rogowski coil. The non-contact sensor includes a non-contact sensor element and a clamp having a pair of clamping jaws. The pair of clamping jaws is configured to hold the conductor, and the non-contact sensor element is configured to press against the conductor to sense an electrical characteristic of the conductor.

The clamp may be a spring loaded clamp having a pair of clamping jaws in the central region of the Rogowski coil. The pair of clamping jaws is configured to hold the conductor to be tested in the central region of the Rogowski coil, wherein a non-contact sensor element is located on an inner surface of one of the pair of clamping jaws. The measurement system further includes a measurement instrument operatively coupled to the sensor probe, the measurement instrument including control circuitry configured to send signals to and receive signals from the sensor probe.

The sensor probe or the measurement system may include another feature, such as the non-contact sensor is removably coupled to the Rogowski coil. The non-contact sensor and the Rogowski coil are configured to operate while decoupled.

The sensor probe or the measurement system may include another feature, such as the first and second leads of the Rogowski coil are received in sockets of a handle member of the Rogowski coil. The spring loaded clamp includes through openings, the handle member of the Rogowski coil located in the through openings of the spring loaded clamp.

The sensor probe or the measurement system may include another feature, such as the sensor probe includes a first wire coupling the Rogowski coil to the measurement instrument and a second wire coupling the non-contact sensor to the measurement instrument.

The sensor probe or the measurement system may include another feature, such as the non-contact sensor being permanently fixed to the Rogowski coil.

The sensor probe or the measurement system may include another feature, such as the first lead being permanently fixed to a first socket, and the second lead being configured to be removably fixed to the second leads.

In view of the foregoing disclosure, various examples of a method of operation may include any one or combination of the following features: removing the non-contact sensor from the first position and removing the Rogowski coil from the second position, and separating the non-contact sensor from the Rogowski coil. The method may further include moving handles of the clamp towards each other to cause the pair of jaws to move away from each or moving a first handle of the clamp towards a second handle to cause the pair of jaws to move away from each. The method may further include placing the pair of jaws around the insulated wire, and releasing the handles to allow the pair of jaws to hold the insulated wire.

A method may include holding a wire with a clamp of a sensing probe such that a non-contact sensor of the sensing probe is placed within a threshold distance to the wire, and the wire is placed in a central region of a Rogowski coil of the sensor probe. While the non-contact sensor of a sensing probe remains in the first position and while the Rogowski coil of the sensor probe remains in the second position, sensing at least one electrical parameter of the wire using the sensor probe.

The methods may include another feature, such as removing the non-contact sensor from the first position and removing the Rogowski coil from the second position, and separating the non-contact sensor from the Rogowski coil.

The methods may include another feature, separating the non-contact sensor from the Rogowski coil, using the non-contact sensor to sense a first electrical parameter of the wire, and the Rogowski coil to sense a second electrical parameter of the wire.

The methods may include another feature comprising sending a first signal indicative of the first electrical parameter to a measurement instrument, and sending a second signal indicative of the second electrical parameter to the measurement instrument. The first signal and the second signal may be sent to the measurement instrument over first and second wires, respectively. Alternatively, the first and second signals may be sent to the measurement instrument over the same wire.

The method may include another feature, such as moving handles of the clamp towards each other to cause the pair of jaws to move away from each, placing the pair of jaws around the insulated wire, and releasing the handles to allow the pair of jaws to hold the insulated wire.

The method may include another feature, such as moving a first handle of the clamp towards a second handle to cause the pair of jaws to move away from each other, placing the pair of jaws around the insulated wire, and releasing the first handles to allow the pair of jaws to hold the insulated wire.

The method may include another feature, such as sensing a current using the Rogowski coil and sensing a voltage using the non-contact sensor.

The method may include another feature, such as the pair of jaws holding an insulated wire extend perpendicularly through the central region of the Rogowski coil.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A sensor probe, comprising:
a Rogowski coil forming a loop having first and second leads at opposing ends of the loop, the loop having a central region configured to receive a conductor; and
a non-contact sensor coupled to the Rogowski coil, the non-contact sensor including a non-contact sensor element and a clamp having a pair of clamping jaws, the pair of clamping jaws positioned to hold the conductor in the central region of the loop, wherein the non-contact sensor element is configured to press against the conductor to sense an electrical characteristic of the conductor.

2. The sensor probe of claim 1, wherein the clamp of the non-contact sensor is permanently coupled to the Rogowski coil.

3. The sensor probe of claim 1, wherein the jaws of the clamp are configured to hold the conductor so that a surface of an insulative material around the conductor aligns with and abuts the non-contact sensor element.

4. The sensor probe of claim 1, wherein the central region of the loop is 30% of an area inside of the loop.

5. The sensor probe of claim 4, wherein the central region is centered about a center point of the area inside of the loop.

6. The sensor probe of claim 1, further comprising one or more sensing heads configured to receive signals from the Rogowski coil and the non-contact sensor.

7. The sensor probe of claim 1, wherein the pair of clamping jaws comprise first and second jaws that are concave shaped, wherein the first jaw is longer than the second jaw.

8. The sensor probe of claim 1, wherein the non-contact sensor is configured to be separated from the Rogowski coil in a separated state, wherein the non-contact sensor and the Rogowski coil are operable in the separated state.

9. The sensor probe of claim 1, wherein both the first and second leads of the Rogowski coil are removably fixed to respective sockets.

10. A measurement system, comprising:
   a sensor probe configured to sense an electrical parameter in a conductor, the sensor probe including:
      a Rogowski coil having first and second leads at opposing ends, the Rogowski coil having a central region configured to receive a conductor to be tested;
      a non-contact sensor coupled to the Rogowski coil, the non-contact sensor including a non-contact sensor element and a clamp having a pair of clamping jaws, the pair of clamping jaws positioned to hold the conductor in the central region of the Rogowski coil, wherein the non-contact sensor element is configured to press against the conductor to sense an electrical characteristic of the conductor; and
   a measurement instrument operatively coupled to the sensor probe, the measurement instrument including control circuitry configured to send signals to and receive signals from the sensor probe.

11. The measurement system of claim 10, wherein the non-contact sensor is removably coupled to the Rogowski coil, wherein the non-contact sensor and the Rogowski coil are configured to operate while decoupled.

12. The measurement system of claim 11, wherein the first and second leads of the Rogowski coil are received in sockets of a handle member of the Rogowski coil, the clamp including through openings, the handle member of the Rogowski coil located in the through openings of the clamp.

13. The measurement system of claim 11, wherein the sensor probe includes a first wire coupling the Rogowski coil to the measurement instrument and a second wire coupling the non-contact sensor to the measurement instrument.

14. The measurement system of claim 10, wherein the non-contact sensor is permanently fixed to the Rogowski coil.

15. The measurement system of claim 10, wherein the first lead is permanently fixed to a first socket, and the second lead is configured to be removably fixed to a second socket.

16. A method, comprising:
   holding a wire with a clamp of a sensor probe such that (1) a non-contact sensor of the sensor probe is placed within a threshold distance to the wire and (2) the wire is placed in a central region of a Rogowski coil of the sensor probe; and
   while the non-contact sensor of the sensor probe remains within the threshold distance and while the wire is in the central region of the Rogowski coil, sensing at least one electrical parameter of the wire using the sensor probe.

17. The method of claim 16, wherein sensing the at least one electrical parameter of the wire using the sensor probe comprises sensing a current using the Rogowski coil and sensing a voltage using the non-contact sensor within the threshold distance.

18. The method of claim 16, comprising:
   separating the non-contact sensor from the Rogowski coil;
   using the non-contact sensor to sense a first electrical parameter of the wire; and
   using the Rogowski coil to sense a second electrical parameter of the wire.

19. The method of claim 18, comprising sending a first signal indicative of the first electrical parameter to a measurement instrument, and sending a second signal indicative of the second electrical parameter to the measurement instrument.

20. The method of claim 19, wherein the first signal and the second signal are sent to the measurement instrument over first and second wires, respectively.

* * * * *